United States Patent
Miyagawa et al.

(10) Patent No.: US 6,731,101 B2
(45) Date of Patent: May 4, 2004

(54) MODULATION SEMICONDUCTOR INTEGRATED CIRCUIT DEVICE AND TESTING METHOD FOR OSCILLATION CIRCUIT

(75) Inventors: Hirokazu Miyagawa, Takasaki (JP); Katsumi Yamamoto, Kokubunji (JP); Tatsuji Matsuura, Tokyo (JP); Masaru Kokubo, Hannou (JP)

(73) Assignee: Renasas Technology Corp., Tokyo (JP)

( * ) Notice: Subject to any disclaimer, the term of this patent is extended or adjusted under 35 U.S.C. 154(b) by 0 days.

(21) Appl. No.: 10/086,718

(22) Filed: Mar. 4, 2002

(65) Prior Publication Data
US 2003/0048099 A1 Mar. 13, 2003

(30) Foreign Application Priority Data
May 28, 2001 (JP) .......................... 2001-158823

(51) Int. Cl.$^7$ .......................... H03H 13/28; G01R 29/00
(52) U.S. Cl. .............. 324/76.79; 324/76.39; 324/76.77; 331/25; 331/1 R; 375/295
(58) Field of Search ................ 375/295, 296, 375/306; 331/25, 1 R; 332/127; 324/76.39, 76.52, 76.53, 76.77, 76.79

(56) References Cited

U.S. PATENT DOCUMENTS 5,412,353 A * 5/1995 Chaplik et al. ............. 332/127
6,016,080 A * 1/2000 Zuta et al. .................... 331/25

* cited by examiner

Primary Examiner—N. Le
Assistant Examiner—Vincent Q. Nguyen
(74) Attorney, Agent, or Firm—Mattingly, Stanger & Malur, P.C.

(57) ABSTRACT

In accomplishing an LC-oscillation VCO circuit which is immune to frequency deviation and a frequency-hopping radio communication apparatus using the VCO circuit, a modulation semiconductor integrated circuit device is designed to control the LC-oscillation VCO directly with data to be transmitted thereby implementing the modulation and switch the carrier frequency for frequency hopping. The integrated circuit device includes a current adjusting circuit which varies the current value of a D/A conversion circuit for producing a control voltage of VCO in accordance with the carrier frequency so that the variation of a modulation control voltage of VCO has a characteristic that is opposite to the characteristic of modulation frequency deviation, thereby nullifying the modulation frequency deviation of VCO.

12 Claims, 9 Drawing Sheets

MODULATION SEMICONDUCTOR INTEGRATED CIRCUIT DEVICE AND TESTING METHOD FOR OSCILLATION CIRCUIT

BACKGROUND OF THE INVENTION

The present invention relates to a technique useful for the reduction of frequency deviation of the voltage-controlled oscillator (VCO) circuit of LC oscillation type, and particularly to a technique useful for the control of the VCO circuit included in the sending system of a radio communication apparatus which adopt the frequency hopping scheme for example.

In the present situation of crowded radio signals of various communication schemes across the sky brought about by the advanced radio communication technology, the normality of data transmission might be jeopardized due to the interference among signals and the fading. For coping with this matter, there is known a radio communication system which changes the carrier frequency of a signal thereby to prevent the crosstalk with other signals of adjacent frequency bands. For example, a protocol called Bluetooth, which standardizes the wireless data transmission for personal computers and their peripheral units such as printers, adopts the spread spectrum scheme based on frequency hopping of 1-MHz step in the frequency band of 2.4–2.48 GHz (2.4 GHz band) as shown in FIG. 9, thereby preventing the crosstalk of signals of adjacent frequency bands. The Bluetooth protocol also adopts the frequency modulation scheme which renders the modulation of ±160 kHz to the carrier signal for data transmission.

In this frequency modulation, it is conceivable to control the frequency by controlling the VCO circuit directly by the transmission data. There is known a VCO circuit which controls the oscillation frequency by varying the current with a control voltage, and also known a VCO circuit of LC oscillation type which varies the oscillation frequency by varying the capacitance of a variable capacitor with a control voltage.

SUMMARY OF THE INVENTION

In the case of frequency modulation by data of transmission based on frequency hopping, frequency hopping control is needed for the carrier signal in addition to the frequency modulation by the data, and accordingly two control systems are necessary.

The inventors of the present invention have studied the use of an LC-oscillation VCO circuit which includes varactor diodes as shown in FIG. 2 in developing a radio communication LSI (large-scale semiconductor integrated circuit) device which adopts the above-mentioned radio communication scheme.

The study has revealed that the adoption of frequency modulation based on direct control of LC-oscillation VCO is problematic in that the switching of carrier frequency causes the frequency deviation to arise. The Bluetooth protocol recommends a modulation range of ±140–175 kHz for the transmission of a signal having its 2.4-GHz carrier signal rendered the ±160-kHz modulation. Namely, it allows a margin of 35 kHz.

According to the study of the above-mentioned LC-oscillation VCO by the present inventors, when it is attempted to modulate the carrier signal at a constant level in accordance with transmission data, i.e., when it is attempted to control the oscillation frequency of the VCO shown in FIG. 2 at a constant level of control voltage Vcnt2 irrespective of the carrier frequency, switching of frequency by another control voltage Vcnt1 of frequency hopping causes the variation of not only the capacitance of one varactor diode pair Dv11 and Dv12, but also the total capacitance of another varactor diode pair Dv21 and Dv22.

The LC-oscillation VCO has its oscillation frequency $f_{osc}$ evaluated as follows.

$$f_{osc} = \frac{1}{2\pi\sqrt{LC}} \quad (1)$$

The rate of frequency variation in response to the variation of capacitance C (i.e., $df_{osc}/dC$) is formulated as follows.

$$\begin{aligned}\frac{df_{osc}}{dC} &= \frac{1}{2\pi\sqrt{L}} \cdot \left(-\frac{1}{2}\right) \cdot \left(\frac{1}{\sqrt{C}}\right)^3 \\ &= \frac{1}{2\pi\sqrt{LC}} \cdot \left(-\frac{1}{2}\right) \cdot \left(\frac{1}{C}\right) \\ &= \left(-\frac{1}{2}\right) \cdot \frac{f_{osc}}{C} = \left(-\frac{1}{2}\right) \cdot f_{osc} \cdot (2\pi f_{osc})^2 \cdot L \\ &= -2\pi^2 \cdot f_{osc}^3 \cdot L\end{aligned} \quad (2)$$

Accordingly, the rate of frequency variation in response to the variation of capacitance C ($df_{osc}/dC$) is proportional to the third power of $f_{osc}$. It was revealed that the frequency variation caused by the variation of the above-mentioned total capacitance resulting from the control of hopping carrier frequency varies the modulation gain of VCO, causing the modulation frequency to deviate with the carrier frequency as shown in FIG. 7A. A presumed reason for this affair is open-loop control of the oscillation frequency for modulation against closed-loop control of the oscillation frequency for frequency hopping.

The modulation frequency deviation is maximum when the VCO oscillation frequency $f_{osc}$ hops from 2.402 GHz to 2.480 GHz. The variation of modulation gain for f1=2.402 GHz and f2=2.480 GHz is evaluated as follows.

Modulation gain at high-limit frequency/Modulation gain at $$\frac{\text{high-limit frequency}}{\text{low-limit frequency}} = \left(\frac{f_2}{f_1}\right)^3 = \left(\frac{2.48 \text{ GHz}}{2.402 \text{ GHz}}\right)^3 \approx 1.1 \quad (3)$$

Specifically, the modulation gain has a 10% variation between the high-limit and low-limit of the VCO oscillation frequency as shown in FIG. 7A. This graph is plotted to present the modulation frequency deviation in terms of the ratio which is based on the frequency deviation of "1" at a carrier frequency of 2.44 GHz, i.e., the control voltage Vcnt2 is set such that the modulation frequency is intended 160 kHz when the carrier frequency is 2.44 GHz. Therefore, the 10% variation is equivalent to 16 kHz.

On this account, frequencies as much as 16 kHz out of the 35-kHz frequency margin is lost due to frequency hopping, leaving a practical frequency margin of 20 kHz or less. When the variations of temperature and power voltage are considered, the frequency margin further decreases, and it becomes extremely difficult to design a sending system circuit having optimal characteristics.

The present invention is intended to solve the above-mentioned prior art problem, and its prime object is to reduce the frequency deviation of the LC-oscillation VCO circuit and of the VCO in the modulation semiconductor integrated circuit device used in a radio communication apparatus of frequency hopping type.

Another object of this invention is to provide a modulation semiconductor integrated circuit device useful for building a radio communication apparatus which is immune to crosstalk and performs accurate data transmission.

Among the affairs of the present invention disclosed in this specification, representatives are briefed as follows.

The inventive modulation semiconductor integrated circuit device controls a voltage-controlled oscillation circuit with a first control voltage to produce a base frequency signal, controls at the same time the voltage-controlled oscillation circuit with a second control voltage which is based on data to be transmitted thereby to implement the frequency modulation, and transmits the data signal while changing the base frequency, wherein the integrated circuit device controls the base current value of a circuit which generates the second control voltage in response to the change of the base frequency such that the variation of the second control voltage of the voltage-controlled oscillation circuit has a characteristic opposite to the characteristic of modulation frequency deviation of the voltage-controlled oscillation circuit.

More specifically, the inventive modulation semiconductor integrated circuit device produces a carrier frequency signal with an LC-oscillation VCO, controls at the same time the LC-oscillation VCO based on data to be transmitted thereby to implement the frequency modulation, and transmits the data signal while changing the carrier frequency, wherein the integrated circuit device varies the base current value of a circuit (e.g., D/A conversion circuit) which produces a control voltage of the VCO in response to the change of the carrier frequency such that the variation of the modulation control voltage (Vcnt2) of VCO has a characteristic shown by FIG. 7B which is opposite to the characteristic of modulation frequency deviation of VCO as shown by 7A, thereby nullifying the modulation frequency deviation of VCO as shown by FIG. 7C.

The above-mentioned scheme eliminates the modulation frequency deviation of VCO, resulting in an increased frequency margin, thereby facilitating the circuit design. With the integrated circuit device of the above-mentioned arrangement being applied to a radio communication apparatus of frequency hopping type, a radio communication apparatus which is immune to crosstalk and performs accurate data transmission can be accomplished.

Preferably, the integrated circuit device further includes a phase comparison circuit which compares in phase the oscillation output of the voltage-controlled oscillation circuit with a reference clock signal, and a control voltage generation circuit which generates, in accordance with the phase difference detected by the phase comparison circuit, such a voltage that the phase difference dissolves and applies as the first control voltage to the voltage-controlled oscillation circuit, and the voltage-controlled oscillation circuit, phase comparison circuit and control voltage generation circuit are connected to form a phase-locked loop. In consequence, a signal having a reference frequency such as the carrier frequency can be produced stably and accurately.

Preferably, the second control voltage is supplied to the voltage-controlled oscillation circuit through a path separate from the path of the phase-locked loop. In consequence, the circuit for producing the second control voltage can be simplified as compared with the case of forming a circuit in the phase-locked loop, and the circuit design is facilitated and the take-up circuit area can be reduced.

In case the circuit for producing the second control voltage is made up of a digital filter which samples the transmission data signal and implements the product-sum computation, and a D/A conversion circuit which implements the D/A conversion for the output of the digital filter, the above-mentioned controlled reference current value is used for the reference current value of the D/A conversion circuit. The technique of adjusting the current value of D/A conversion circuit has been used conventionally, and a control voltage having an intended characteristic can readily be produced by using this technique.

The integrated circuit device further includes within the phase-locked loop a variable counter circuit which counts the oscillation output of the oscillation circuit, and a register which sets a value to be counted by the variable counter, so that the above-mentioned base frequency is changed in response to the alteration of the value set in the register and the above-mentioned base current value is controlled in accordance with the value set in the register. Inconsequence, the separate provision of registers for switching the frequency and adjusting the base current value is not needed, the circuit scale can be reduced, and the setting in need is of only one value.

The integrated circuit device preferably further includes a trimming circuit which adjusts the above-mentioned base current value. In consequence, accurate modulation is made possible.

The voltage-controlled oscillation circuit includes a first variable capacitance means and a second variable capacitance means, with their capacitance values being varied in response to the first control voltage and second control voltage, respectively, so that the oscillation frequency is varied by the control voltages. In consequence, an apparatus having its two systems controlled by one oscillation circuit can readily be accomplished.

The integrated circuit device is designed so that the count result of the variable counter circuit is accessible by read-out from the outside through an external terminal, and the internal counter can be used for the test of oscillation frequency. Preferably, the variable counter has its count result read out through the external terminal via the register and the register setting path. In consequence, the separate provision of a counter readout path is not needed, and the circuit scale can be reduced.

The inventive test method is for a semiconductor integrated circuit device which includes a voltage-controlled oscillation circuit having its oscillation frequency controlled by a first control voltage and a second control voltage individually, a phase comparison circuit which compares in phase the oscillation output of the voltage-controlled oscillation circuit with a reference clock signal, and a control voltage generation circuit which generates, in accordance with the phase difference detected by the phase comparison circuit, such a voltage that the phase difference dissolves and applies as the first control voltage to the voltage-controlled oscillation circuit, with the voltage-controlled oscillation circuit, phase comparison circuit and control voltage generation circuit being connected to form a phase-locked loop, and with the second control voltage being supplied to the voltage-controlled oscillation circuit through a path separate from the path of the phase-locked loop, wherein the method activates the oscillation circuit for the test operation by applying the second control voltage which is made higher than the voltage for the normal operation, counts the output of the oscillation circuit with a counter, and tests the variation of the output frequency of the oscillation circuit caused by the second control voltage by making reference to the count value in a certain duration of the counter.

This test method enables the counting of the oscillation output more accurately relative to the normal operation even by using the same counter, and thus enables the accurate frequency test.

These and other objects and novel features of the present invention will be apparent from the following description and accompanying drawings.

DETAILED DESCRIPTION OF THE PREFERRED EMBODIMENTS

Preferred embodiments this invention will be explained with reference to the drawings.

Figure 1:
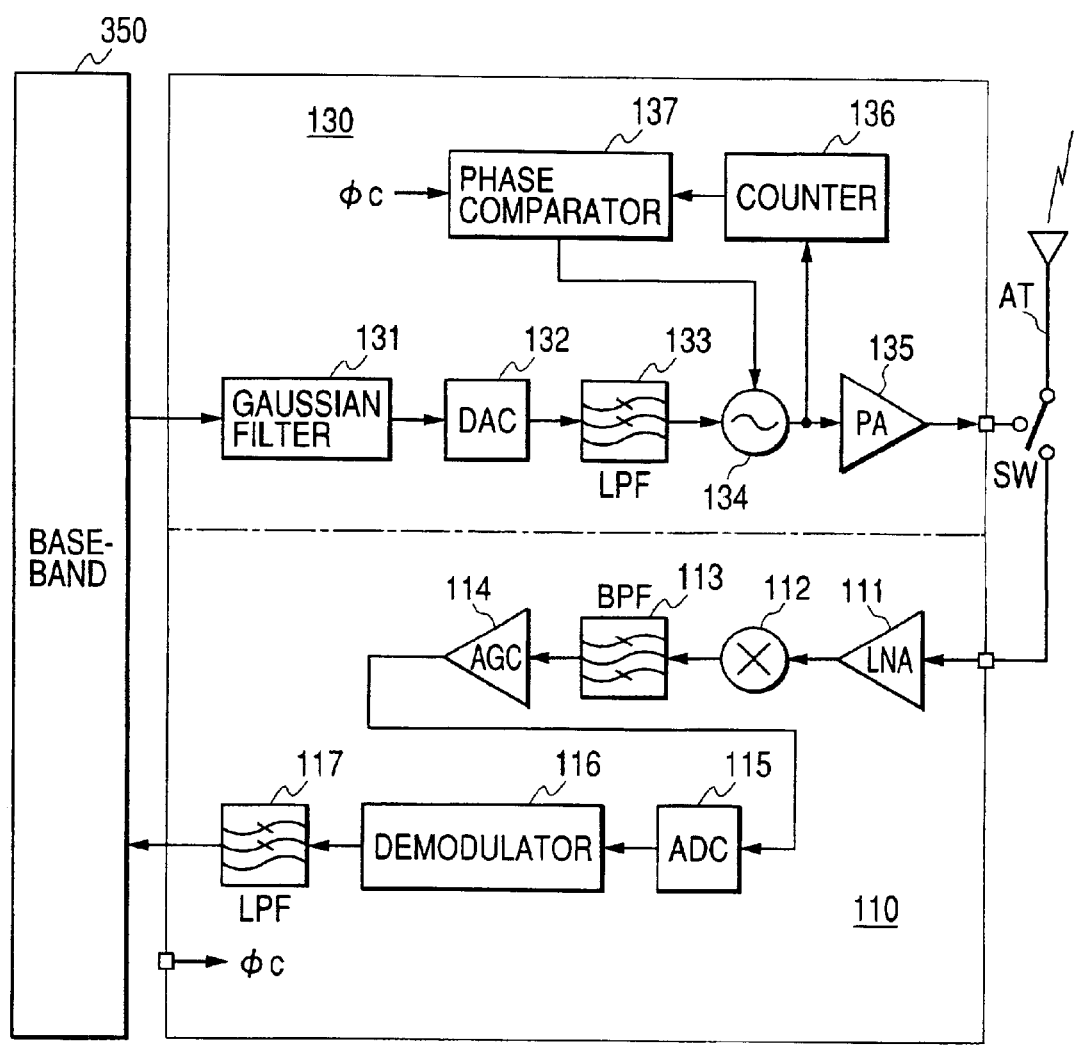
FIG. 1 is a block diagram showing an example of the radio communication apparatus which is arranged properly by using the modulation semiconductor integrated circuit device based on this invention.

FIG. 1 shows an example of the arrangement of a radio communication apparatus by proper use of the inventive modulation semiconductor integrated circuit device.

In the figure, the apparatus includes an antenna AT for the transmission and reception of radio signals, a switch SW used to switch between the send and receive operations, a receiving system circuit 110 which down-converts the radio signal received by the antenna AT to have an intermediate frequency and demodulates and amplifies the resulting IF signal to produce a baseband signal, and a sending system circuit 130 which modulates and converts the frequency of the baseband signal to be transmitted by the antenna AT.

The sending system circuit 130 is made up of a Gaussian filter 131 which samples the input rectangular waveform signal to produce modulation codes, a D/A conversion circuit 132 which D-A converts the filter output to produce a stepping waveform signal, a low-pass filter 133 which smoothes the stepping waveform signal, a frequency conversion circuit 134, which is a voltage-controlled oscillation circuit (VCO) having its oscillation frequency controlled by the output voltage of the low-pass filter 133, thereby working for modulation, and a power amplifier 135 which amplifies the frequency-converted signal to drive the antenna AT so that the modulated signal is transmitted.

The sending system circuit 130 of this embodiment further includes a counter 136 which counts down the output frequency of the VCO 134, and a phase comparison circuit 137 which compares in phase the output of the counter 136 with a reference clock signal (φc) of 13 MHz for example and releases a voltage derived from the phase difference to control the oscillation frequency of the VCO 134. The VCO 134, counter 136 and phase comparison circuit 137 form in unison a PLL (phase-locked loop), which produces a carrier frequency signal. The VCO 134 has its oscillation frequency varied by the output voltage of low-pass filter 133 which represents the transmission signal, thereby modulating the carrier frequency signal.

The radio communication apparatus of this embodiment is designed to be able to change the value of counter register to be counted by the counter 136 by being accessed from the baseband circuit 350, thereby performing the spread spectrum data transmission based on frequency hopping by shifting the carrier frequency by a 1-MHz step for example.

The Gaussian filter 131 used in this embodiment is a filter of FIR (finite impulse response) type, which is formed of a shift register which introduces input data sequentially and a product-sum calculator which sums the input data sequentially by multiplying a filter factor to each piece of data. The input shift register has seven stages, the filter factor has five bits, and the filter output has five bits, although this affair is not compulsory.

The receiving system circuit 110 is made up of a low-noise amplifying circuit (LNA) 111 which amplifies the signal which is received by the antenna AT, a down-converting mixer (MIX) 112 which down-converts the amplified reception signal to have an intermediate frequency (e.g., 2 MHz) by mixing the amplified reception signal and the oscillation signal provided by the VCO of sending system, a band-pass filter 113 which eliminates leaking signals from adjacent channels and extracts the signal component of the channel, a programmable gain amplifier (AGC) 114 which amplifies at a variable gain the reception signal to have a certain level, an A/D conversion circuit 115 which converts the analog signal into a digital signal, a demodulation circuit 116 which demodulates the reception signal, and a low-pass filter (LPF) 117 which eliminates high-frequency components (noise) from the demodulated signal and delivers the reception data signal to the baseband circuit 350.

Figure 2:
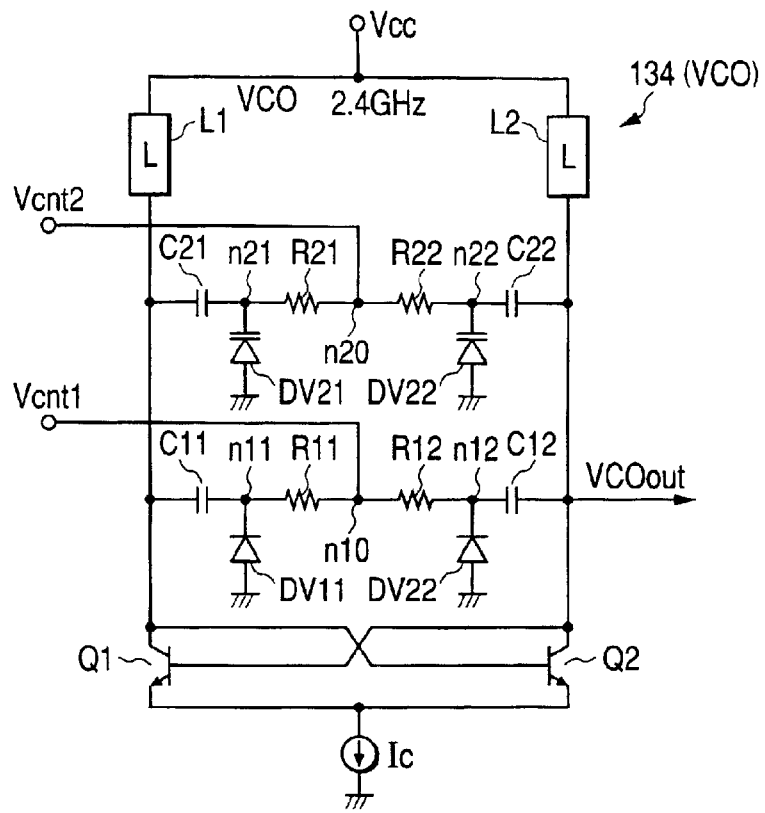
FIG. 2 is a schematic circuit diagram showing an embodiment of the LC-oscillation VCO used in the modulation semiconductor integrated circuit device of this invention.

FIG. 2 shows an embodiment of the LC oscillation circuit used for the VCO 134 of the sending system circuit 130.

This oscillation circuit is made up of a pair of bipolar transistors Q1 and Q2 having their emitters connected together and their bases and collectors in cross connection, a constant current source Ic connected between the common emitters of Q1 and Q2 and the ground point, inductors L1 and L2 connected between the respective collectors of Q1 and Q2 and the power voltage terminal Vcc, a serial connection of a capacitor C11, resistors R11 and R12 and a capacitor C12 and another serial connection of a capacitor C21, resistors R21 and R22 and a capacitor C22 connected in parallel between the collectors of Q1 and Q2, and varactor diodes Dv11, Dv12, Dv21 and Dv22 connected between the nodes n11, n12, n21 and n22 of the capacitors C11, C12, C21 and C22 and the resistors R11, R12, R21 and R22, respectively, and the ground point.

Applying the control voltage Vcnt1 from the phase comparison circuit 137 shown in FIG. 1 to the node n10 of R11 and R12 determines the carrier frequency, and applying the control voltage Vcnt2 from the low-pass filter 133 shown in FIG. 1 to the node n20 of R21 and R22 controls the modulation frequency. Based on the generation of a stable and accurate carrier frequency with this closed PLL circuit and the modulation of the frequency in accordance with the external control voltage, the circuit arrangement can be simpler and the circuit area can be smaller as compared with the control scheme of feeding a modulation signal into the loop of PLL circuit.

By the arrangement in which, at the time of feeding the frequency modulating control voltage Vcnt2 to the VCO 134, the feedback path from the VCO 134 to the phase comparison circuit 137 is cut when the carrier frequency of the PLL circuit has settled and the immediately previous control voltage Vcnt1 is held in the capacitor of the loop filter 139, it is possible to prevent the carrier frequency from deviating. The accurate oscillating operation at the prescribed frequency can be resumed by restoring the feedback of PLL on completion of modulation.

According to the LC-oscillation VCO arranged as described above, if the carrier frequency is switched for frequency hopping with the control voltage Vcnt1, while the control voltage Vcnt2 is retained at a constant level irrespective of the carrier frequency, the voltage variation on the node n10 affects the voltages on the nodes n21 and n22, and a resulting variation of capacitance of one varactor diode pair Dv11 and Dv12 as well as a variation of total capacitance inclusive of another varactor diode pair Dv21 and Dv22 will cause a frequency deviation as large as about 10% at maximum. For coping with this matter, according to this embodiment, when the carrier frequency generated by the VCO 134 is changed, the D/A conversion circuit 132 has its base current adjusted automatically in the direction of reducing the frequency deviation.

Figure 3:
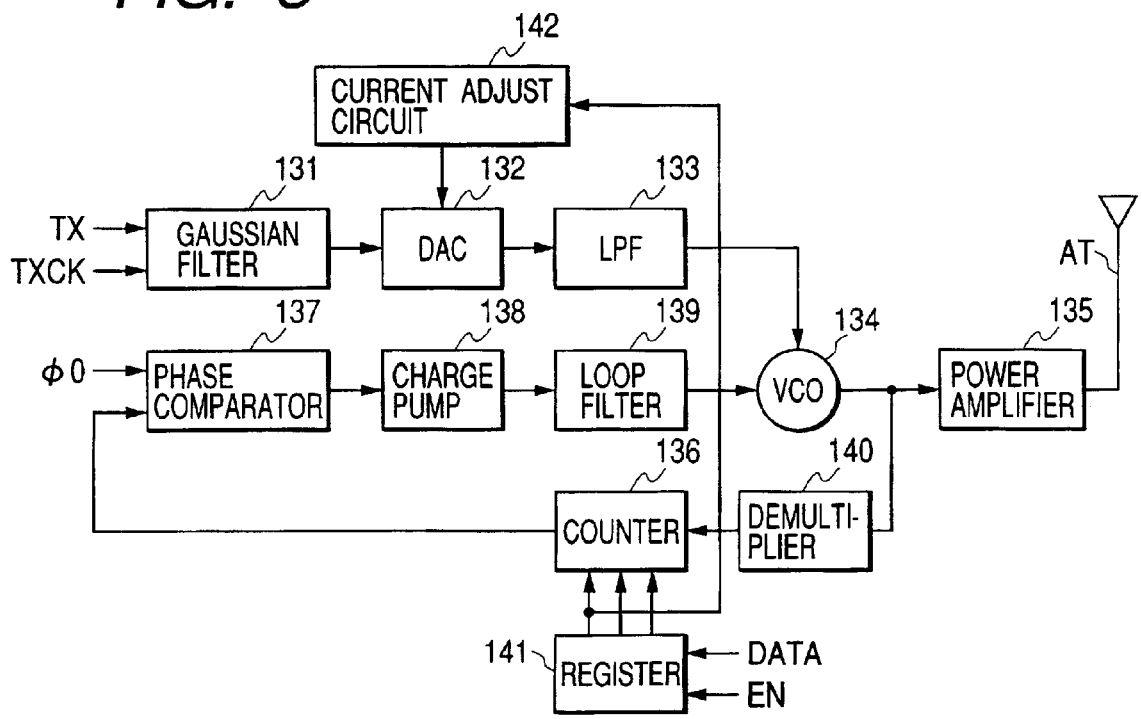
FIG. 3 is a block diagram showing an example of the circuit arrangement of the sending system circuit of the modulation semiconductor integrated circuit device of this invention.

The principle of carrier frequency switching by the VCO 134 and associated current adjustment for the D/A conversion circuit 132 will be explained. FIG. 3 is a detailed block diagram of the sending system circuit 130 shown in FIG. 1. The identical circuit blocks are referred to by the same symbols in these figures.

The phase comparison circuit 137 and VCO 134 are interposed by a charge pump 138 which produces a positive or negative voltage in accordance with the phase difference detected by the phase comparison circuit 137 and a loop filter 139 which smoothes the output of the charge pump 138. A closed loop circuit including the VCO 134, frequency demultiplying counter 136, phase comparison circuit 137, charge pump 138 and loop filter 139 constitutes a PLL circuit which oscillates at a certain frequency based on feedback such that the output of the counter 136 is equal in phase to the reference clock signal $\phi 0$. The oscillation output of the closed-loop PLL circuit becomes the carrier frequency signal.

According to this embodiment, the counter 136 is accompanied by a register 141 having its count value changed by the baseband circuit 350 so that the carrier frequency is shifted by a 1-MHz step for example. In the case of the Bluetooth protocol, the register 141 has at least seven bits for enabling the hopping among 79 channels between 2.402 GHz and 2.480 GHz at a 1-MHz interval for example. In this embodiment, the register 141 can have bidirectional data transaction with the counter 136 so that the count value of the counter 136 can be led out by the register 141 to the outside of the integrated circuit device through an external terminal (not shown).

The counter 136 is further accompanied as its front stage by a demultiplier 140 which demultiplies the oscillation output frequency of the VCO 134 by $\frac{1}{64}$ for example. The provision of demultiplier 140 simplifies the circuit arrangement for changing the count value of the counter 136 by the setting of the register 141.

The D/A conversion circuit 132 is accompanied by a current adjusting circuit 142 which adjusts the base current of the D/A conversion circuit 132 in accordance with the value set in the register 141. Based on this arrangement, when the carrier frequency generated by the VCO 134 is changed in response to the value of the register 141, the current adjusting circuit 142 adjusts the base current of D/A conversion circuit 132 automatically in the direction of reducing frequency deviation. The register 141 has its value altered directly by the baseband circuit 350 shown in FIG. 1.

Figure 4:
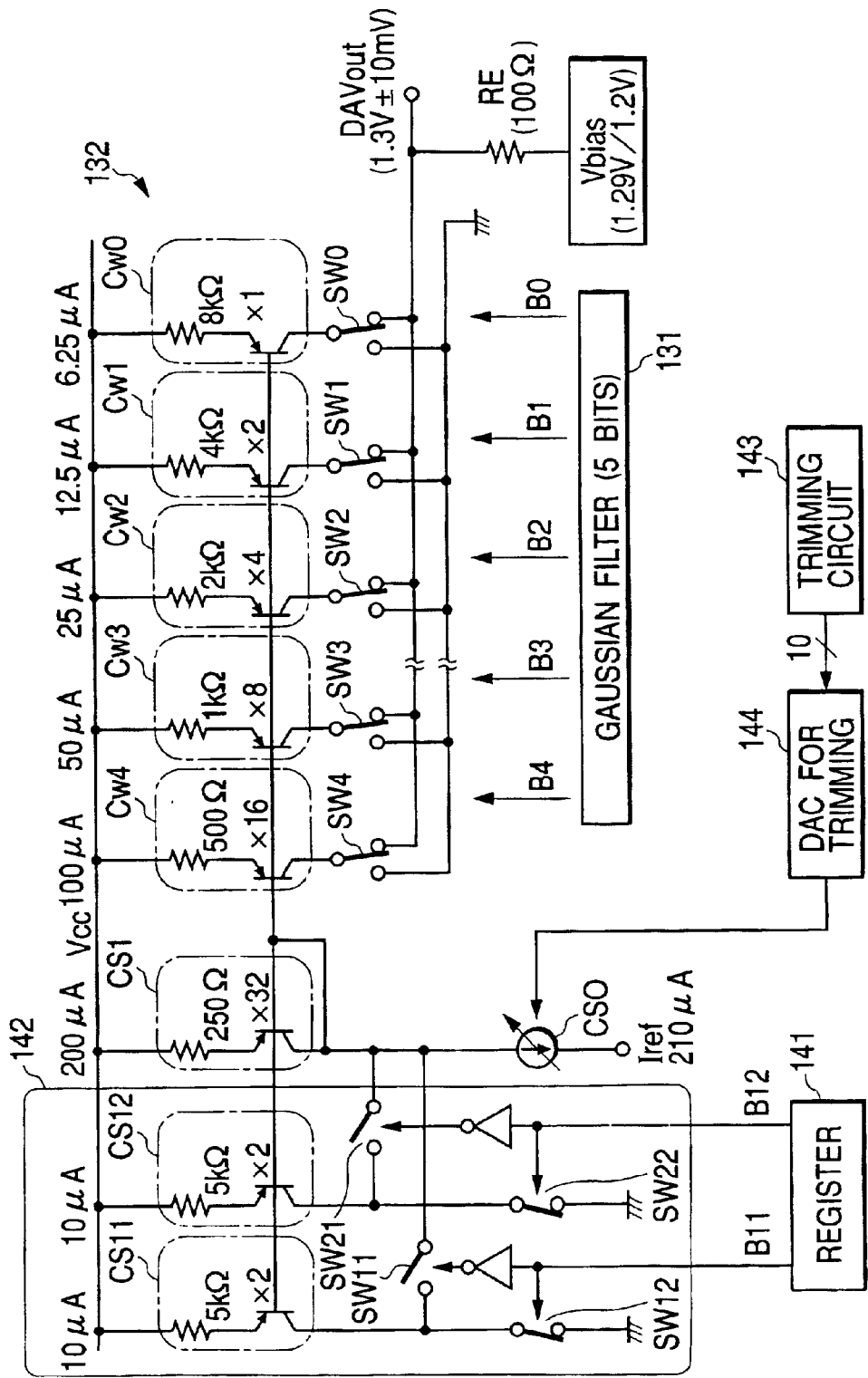
FIG. 4 is a schematic circuit diagram showing an embodiment of the D/A conversion circuit, with a current adjusting circuit being incorporated, which is used for the modulation semiconductor integrated circuit device of this invention.

FIG. 4 shows an embodiment of the D/A conversion circuit 132. The circuit is made up of a reference current source CS0 which produces a reference current Ir of 210 $\mu$A for example, another current source CS1 which is connected in series to the reference current source CS0, weighting current sources Cw0–Cw4 which are connected to the current source CS1 in current-mirror configuration to produce currents that are $\frac{1}{32}$, $\frac{1}{16}$, $\frac{1}{8}$, $\frac{1}{4}$ and $\frac{1}{2}$, respectively, of the reference current, selector switches SW0–SW4 which are connected in series to the respective weighting current sources Cw0–Cw4, and a current-to-voltage converting resistor Re which is connected to one common contacts of the switches SW0–SW4. The switches SW0–SW4 have another common contacts connected to the ground point, so that the currents of the weighting current sources Cw0–Cw4 flow to one of the current-to-voltage converting resistor Re or the ground point by being selected by the switches SW0–SW4.

The D/A conversion circuit 132 has its switches SW0–SW4 operated by the outputs B4–B0 of the Gaussian filter 131. The total current Ic of the switches having positions on the resistor side flows through the resistor Re, and a resulting voltage DAVout, which is one of 32 ($2^5$) voltages corresponding to the outputs B4–B0 of the Gaussian filter 131, is released. The D/A conversion circuit 132 of this embodiment is designed to rectify the disparity of oscillation frequency inherent to the D/A conversion circuit 132 and VCO 134 by the adjustment of the reference current Ir of the circuit 132 based on the provision of a trimming circuit 143 having fuse elements and voltage application pads and a trimming D/A conversion circuit 144 which converts the value set on the trimming circuit 143 into a voltage and fed to the reference current source CS0 of the D/A conversion circuit 132, although this arrangement is not compulsory.

The D/A conversion circuit 132 of this embodiment is designed to be able to adjust the reference current Ir in response to the switching of carrier frequency by the provision of current sources CS11 and CS12 which are connected to the current source CS1 in current-mirror configuration and adapted to produce currents which are each 1/20 of the reference current Ir. Switches SW11 and SW12 are connected between the current sources CS11 and CS12 and the reference current source CS0, and switches SW21 and SW22 are connected between the current sources CS11 and CS12 and the ground point. The current sources CS11 and CS12 and the switches SW11, SW12, SW21 and SW22 constitute the current adjusting circuit 142.

The switches SW11 and SW12 are turned on or off in complementary fashion by the bit (B11) of the 7-bit carrier dance with the VCO oscillation frequency as shown in Table 1 for example.

The Table 1 relevant to this embodiment shows the relation among the value of register 141 (bits B11 and B12), the VCO oscillation frequency, the states of switches SW11 and SW12, the reference current of D/A conversion circuit, and the output voltage DAVout of D/A conversion circuit 133. The contents of Table 1 are derived from the setup in which for carrier frequencies 2.402–2.422 GHz, the switches SW11 and SW22 are both turned off so that the D/A conversion circuit releases a reference current Ir of 210 $\mu$A, for carrier frequencies 2.423–2.454 GHz, only one of the switches SW11 and SW22 is turned on so that the D/A conversion circuit releases a reference current Ir of 200 $\mu$A, and for carrier frequencies 2.454–2.480 GHz, the switches SW11 and SW22 are both turned on so that the D/A conversion circuit releases a reference current Ir of 190 $\mu$A.

TABLE 1

| | PLL generation switching signal (20 mV) | | | | |
|---|---|---|---|---|---|
| VCO output frequency | B11 | B12 | SW11 & SW12 states | DAC reference current | D/A converter output voltage |
| 2402 to 2422 MHz | 0 | 0 | both SWs off | 210 $\mu$A(+5%) | Vbais ± (10 mV + 5%) |
| 2423 to 2455 MHz | 1 | 0 | one SW on | 200 $\mu$A | Vbais ± 10 mV |
| 2456 to 2495 MHz | 1 | 1 | both SWs on | 190 $\mu$A(−5%) | Vbais ± (10 mV − 5%) | frequency switching register 141, while the switches SW21 and SW22 are turned on or off in complementary fashion by the bit (B12) of the 7-bit carrier frequency switching register 141.

Assuming a state that the switches SW11 and SW12 are on and off, and the switches SW21 and SW22 are off and on, respectively, the current from the current source CS11 flows through the on-state switch SW11 to the reference current source CS0, and the current from the current source CS12 flows through the on-state switch SW22 to the ground point. Consequently, the current source CS1 as the original part of the current-mirror circuit has a current value of 200 $\mu$A that is smaller by Ir/20 than the reference current Ir (210 $\mu$A). Similarly, assuming a state that the switches SW11 and SW12 are off and on, and the switches SW21 and SW22 are off and on, respectively, the currents from the current sources CS11 and CS12 flow through the on-state switches SW12 and SW22 to the ground point. Consequently, the current source CS1 as the original part of the current-mirror circuit has a current value that is exactly the reference current Ir (210 $\mu$A).

Figure 5A:
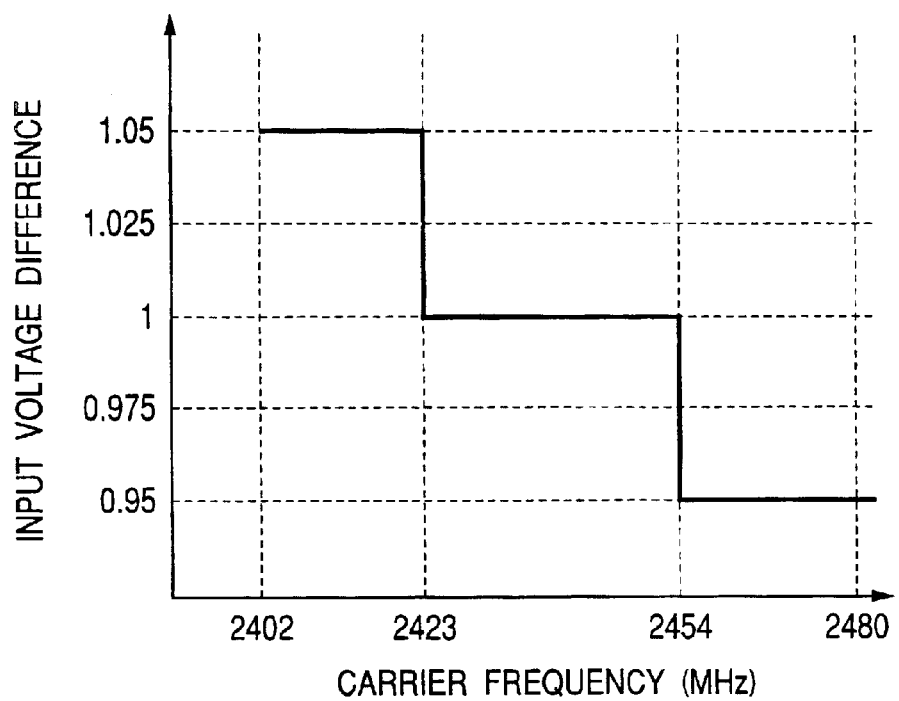
FIGS. 5A and 5B are graphs showing characteristics of the input voltage variation and modulation frequency deviation, respectively, of the VCO having its reference current adjusted in accordance with the carrier frequency by use of the D/A conversion circuit with the current adjusting circuit.
Figure 5B:
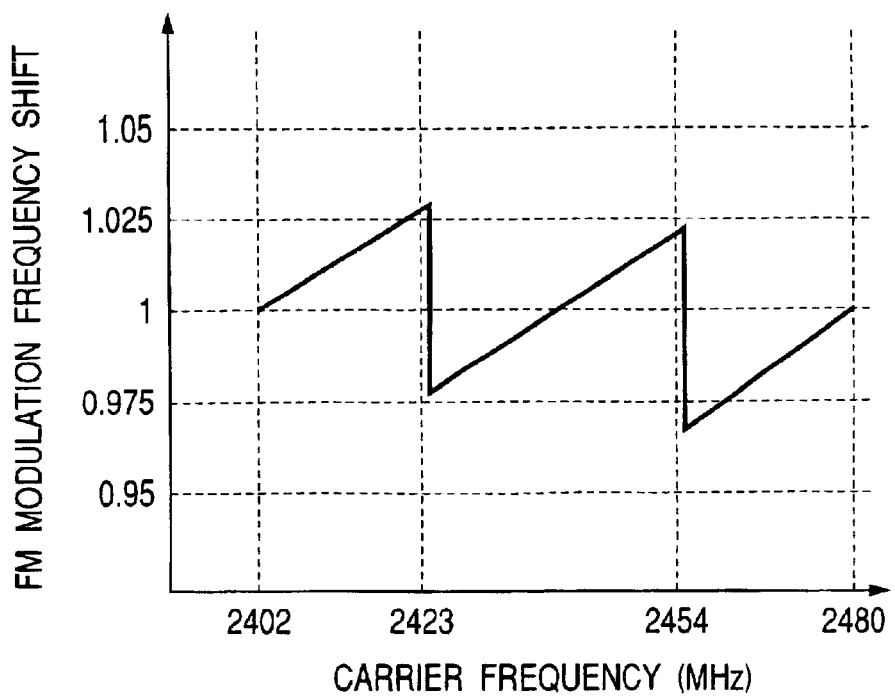

In case the switches SW11 and SW12 are on and off, and the switches SW21 and SW22 are on and off, respectively, the currents from the current sources CS11 and CS12 flow through the on-state switches SW11 and SW21 to the reference current source CS0. Consequently, the current source CS1 as the original part of the current-mirror circuit has a current value of 190 $\mu$A that is smaller by Ir/20 than the reference current Ir (210 1A). In this manner, the current adjusting circuit 142 increases or decreases the currents of the weighting current sources Cw0–Cw4 of the D/A conversion circuit 132, and it is possible to adjust the D/A conversion output voltage even for the same input in accordance with the value of the register 141. Specifically, the register 141 has its value (bits B11 and B12) set in accor- FIGS. 5A and 5B show the VCO input voltage variation and the modulation frequency deviation derived from the setting of the switches SW11 and SW22 based on the Table 1. Comparing between FIG. 5A and FIG. 5B reveals that the implementation of this embodiment adjusts the VCO input voltage (Vcnt2) in accordance with the carrier frequency, and reduces the modulation frequency deviation from ±0.5 (±5%) of the case without any adjustment to ±0.25 (±2.5%).

Although the foregoing embodiment adjusts the reference current Ir of the D/A conversion circuit by segmenting the carrier frequencies 2.402–2.480 GHz into three zones, it is possible in principle to switch the current in accordance with the carrier frequencies of all 79 channels based on the provision of 78 sets of current sources and switches in the current adjusting circuit 142 shown in FIG. 4. In this respect, it is possible to alleviate the huge circuit scale of the current adjusting circuit 142 by adoption of weighted currents, as in the case of the current sources Cw0–Cw4 of the D/A conversion circuit 132, and in this case the circuit 142 necessitates only seven sets of current sources and switches for example.

Figure 6:
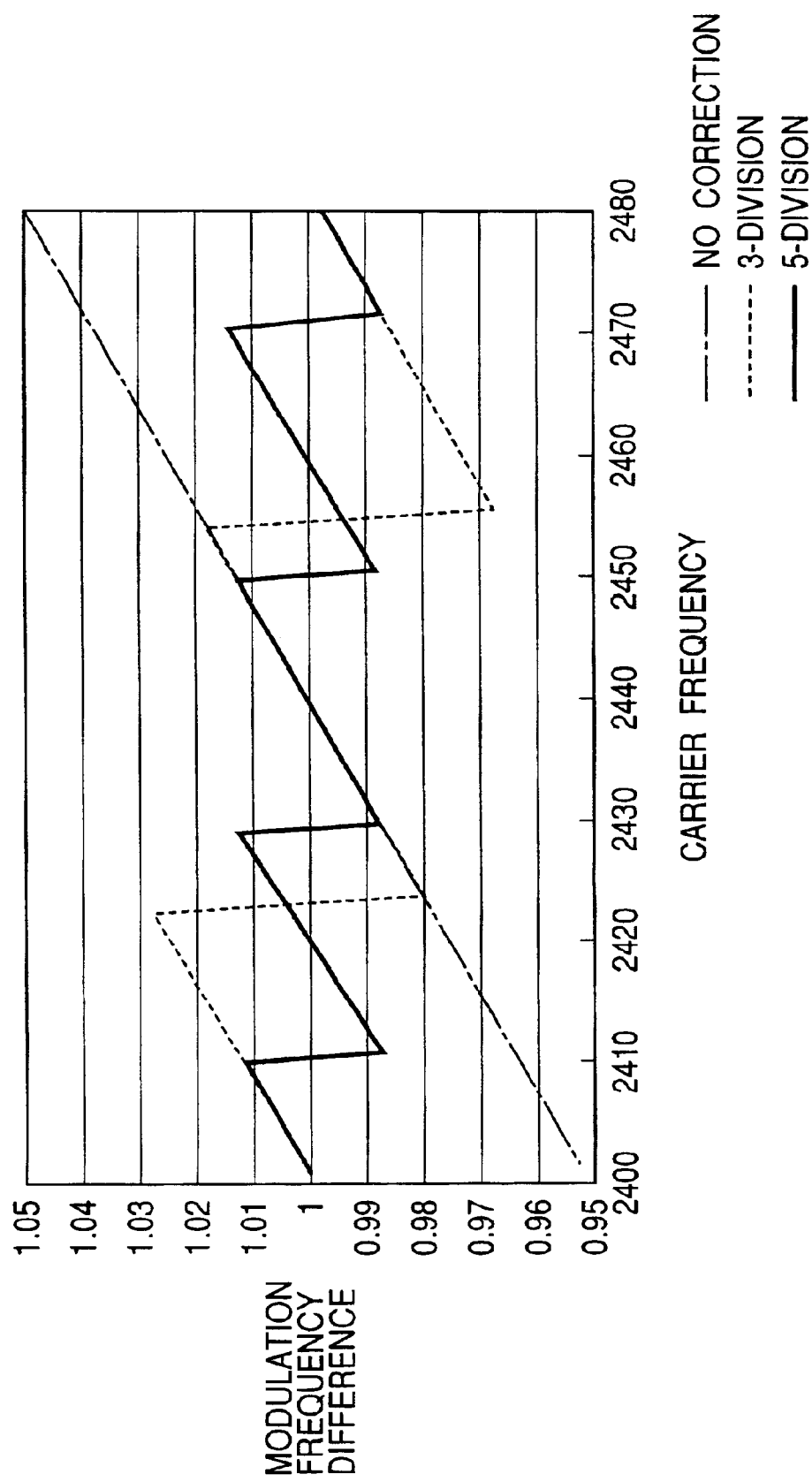
FIG. 6 is a graph showing the modulation frequency deviation resulting from the adjustment of the reference current of the D/A conversion circuit in five steps in accordance with the carrier frequency.
Figure 7A:
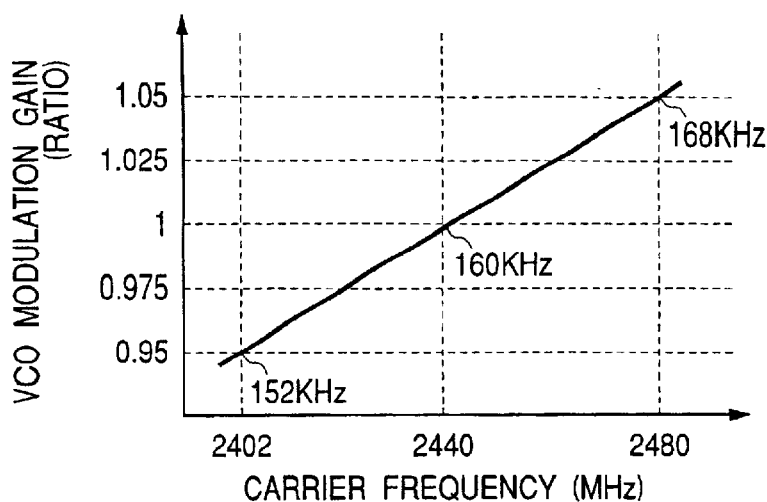
FIGS. 7A, 7B and 7C are graphs showing characteristics of the frequency dependency of modulation gain of VCO, input voltage variation and modulation frequency deviation, respectively.
Figure 7B:
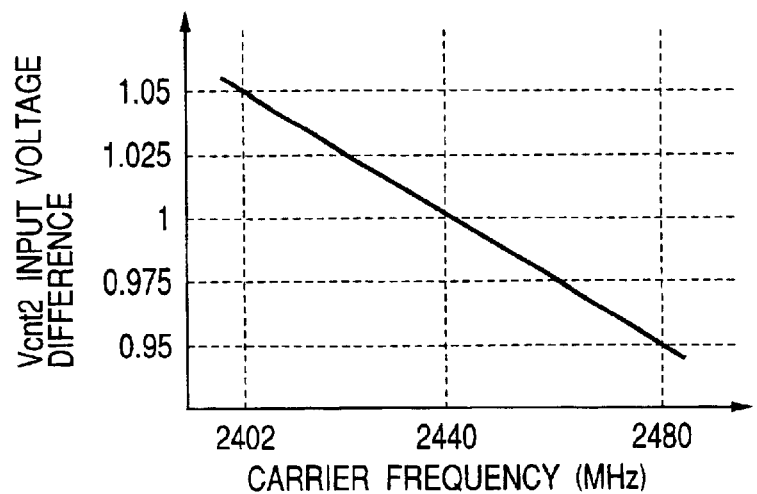
Figure 7C:
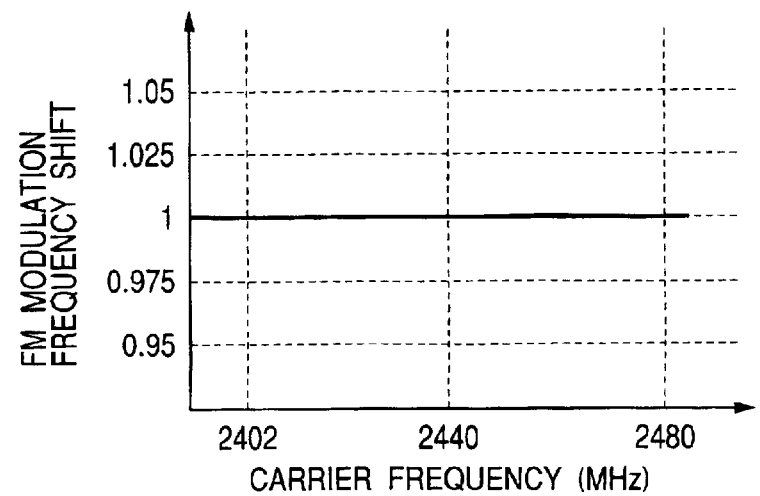

Alternatively, instead of changing the current in correspondence to the carrier frequencies of all 79 channels, the frequency band of 2.402–2.480 GHz is segmented into zones such as five or nine zones and the reference current Ir of D/A conversion circuit is adjusted in five or nine steps. FIG. 6 shows the modulation frequency deviation of the case of adjusting the reference current Ir of D/A conversion circuit in five steps.

FIG. 6 reveals clearly that the modulation frequency deviation which has been ±5% can be confine to the range of about ±1% even by merely segmenting the frequency band into five zones. The ±1% deviation is equivalent in terms of frequency to about 3 kHz, which is about 10% of the 35-kHz frequency margin of Bluetooth protocol mentioned previously, and this value does not matter practically in designing a radio communication apparatus based on the Bluetooth protocol. Accordingly, it is enough for the D/A conversion circuit 132 to have the 5-step adjustment of reference current Ir, and the increase of circuit scale due to the provision of the reference current adjusting circuit 142 for the circuit 132 can be minimized.

Next, the functions of the trimming circuit 143 and trimming D/A conversion circuit 144 shown in FIG. 4 will be explained.

In the manufacturing process of semiconductor integrated circuit devices incorporating VCO, it is generally tested as to whether the VCO oscillation frequency is within the allowable range, and the frequency is adjusted with a trimming circuit if it is out of range. The radio communication LSI device pertinent to this invention also needs to test the VCO oscillation frequency being within the allowable range. The VCO oscillation frequency to be within the allowable range can be checked relatively easily by operating the PLL circuit which produces the carrier frequency for a certain duration and reading out the value of counter 136 thereby to assess the frequency variation.

The counter 136 of this embodiment is designed to operate in unison with the register 141 in such a way that the register 141 receives an active enable signal EN, causing the counter 136 to be reset and start counting and the register 141 holds the count value of the counter 136 when the enable signal EN turns off. However, it is not easy to test accurately by use of the counter 136 in this configuration as to whether the oscillation frequency of VCO 134, which varies in response to the control voltage from the frequency modulating Gaussian filter 131 and D/A conversion circuit 132, is within the allowable range.

For the transmission of a signal modulated by ±160 kHz for the carrier frequency signal of the 2.4 GHz band, the Bluetooth protocol states the modulation range of ±140–175 kHz as mentioned previously. In this case, for testing the oscillation frequency of the VCO which operates based on the voltage provided by the D/A conversion circuit 132, the manner of counting the VCO output in a certain duration with the counter 136 and reading of the count value of the register 141 does not achieve accurate measurement due to the presence of the demultiplier 140 which demultiplies the output frequency of VCO 134 at the front stage of the counter 136.

Specifically, for example, when a 2.4-GHz VCO oscillation frequency is demultiplied by 1/64 and counted for a duration of 2905 μs, the count value will be 2.4 (GHz)×1/64× 2905 (μs)=108937, and the frequency per count is 2.4 (GHz)÷108937=22.031 (kHz). If the VCO modulation frequency is tested to be within the range of ±140–175 kHz with the counter 136, the count value will be (±140–175 kHz)/22.031 (kHz) or it is 6 and 7. Therefore accurate measurement cannot be achieved, and thus accurate trimming is also difficult.

Whereas, this embodiment is devised to multiply the reference current Ir of the D/A conversion circuit 132 by ten to become 2 mA in response to the application of a certain code signal through a pad (not shown) in the trimming circuit 143. The ten-times reference current Ir of 2 mA causes the D/A conversion circuit 132 to have a ten-times maximum output level relative to the normal operation (Ir=200 μA). In response to the application of a signal of 160-kHz modulation by the Gaussian filter 131, the VCO 134 has a ten-times oscillation frequency of 1600 kHz. Accordingly, the counter 136 indicates the frequency variation of 140–175 kHz by count values 65–79, and the measurement accuracy can be improved by about 10 fold.

Table 2 lists in columns (A) and (B) the count values for a low-limit modulation frequency 145 kHz, a target modulation frequency of 160 kHz, and a high-limit modulation frequency of 175 kHz when the D/A conversion circuit 132 is operated in the normal mode and in the test (trimming) mode with a ten-times reference current Ir. Shown in column (C) are examples of count value of the case where trimming is needed as detected based on the scheme of this embodiment.

TABLE 2

| | normal mode | | trimming mode (ten-times Ir) | | |
|---|---|---|---|---|---|
| | KHz | count value | KHz | normal count value | abnormal count value |
| low-limit FM modulation freq. | 145 | 7 | 1450 | 65 | 63 64 |
| target modulation freq. | 160 | 7 | 600 | 72 | 70 71 |
| high-limit FM modulation freq. | 175 | 7 | 1750 | 79 | 77 78 |
| | (A) | | (B) | | (C) |

Operating the VCO 134 and counter 136 without the adoption of this embodiment makes judgements of unneedful trimming as indicated by column (A) of Table 2 even for questionable count values shown in column (C) resulting from the measurement of this embodiment. For the measurement result of column (C), the trimming circuit is used to adjust the reference current Ir of D/A conversion circuit 132 so that the count values are corrected as shown by column (B), and the accuracy of VCO oscillation frequency is enhanced.

Figure 8:
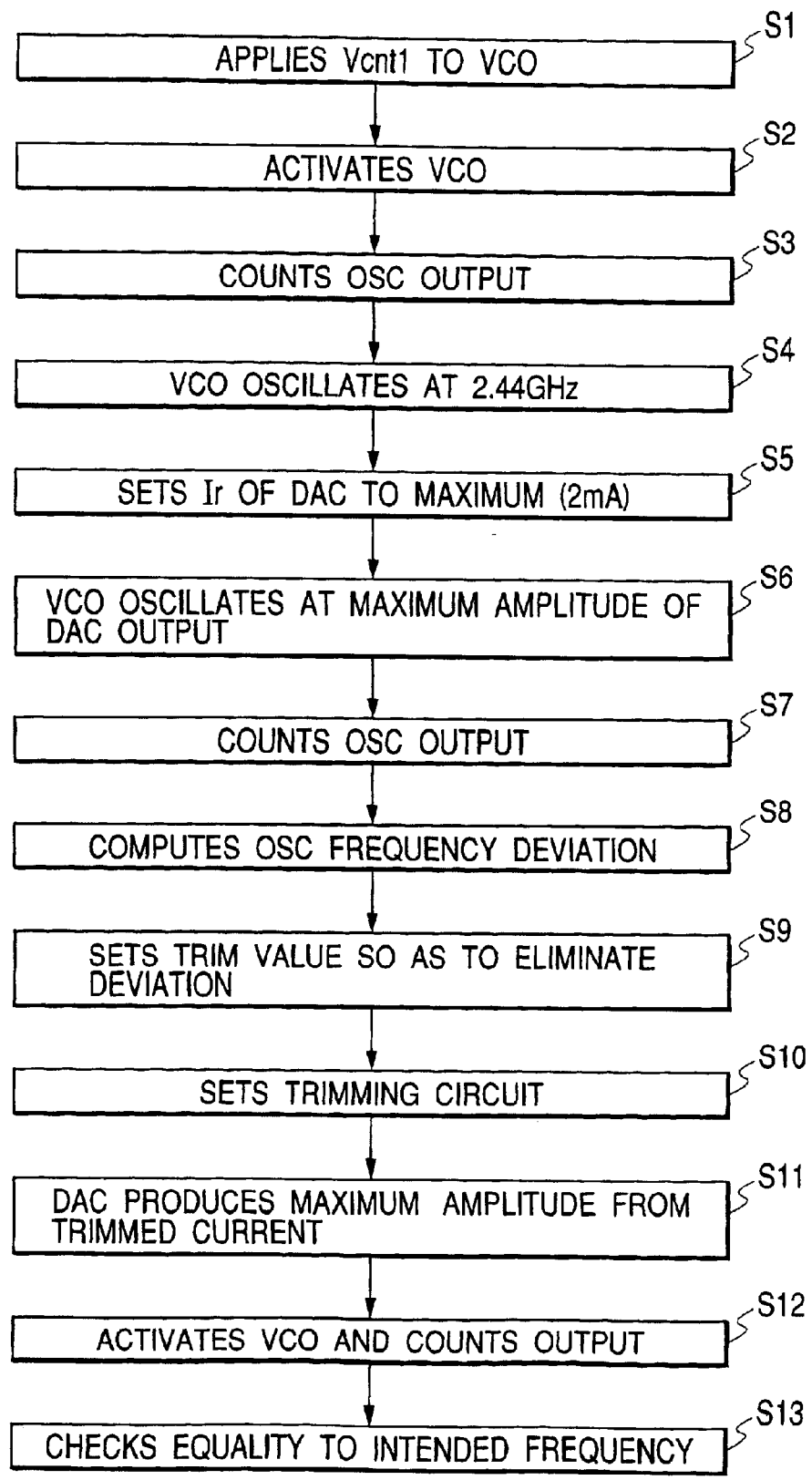
FIG. 8 is a flowchart showing an example of the adjusting operation of the reference current of the D/A conversion circuit by use of a trimming circuit.
Figure 9:
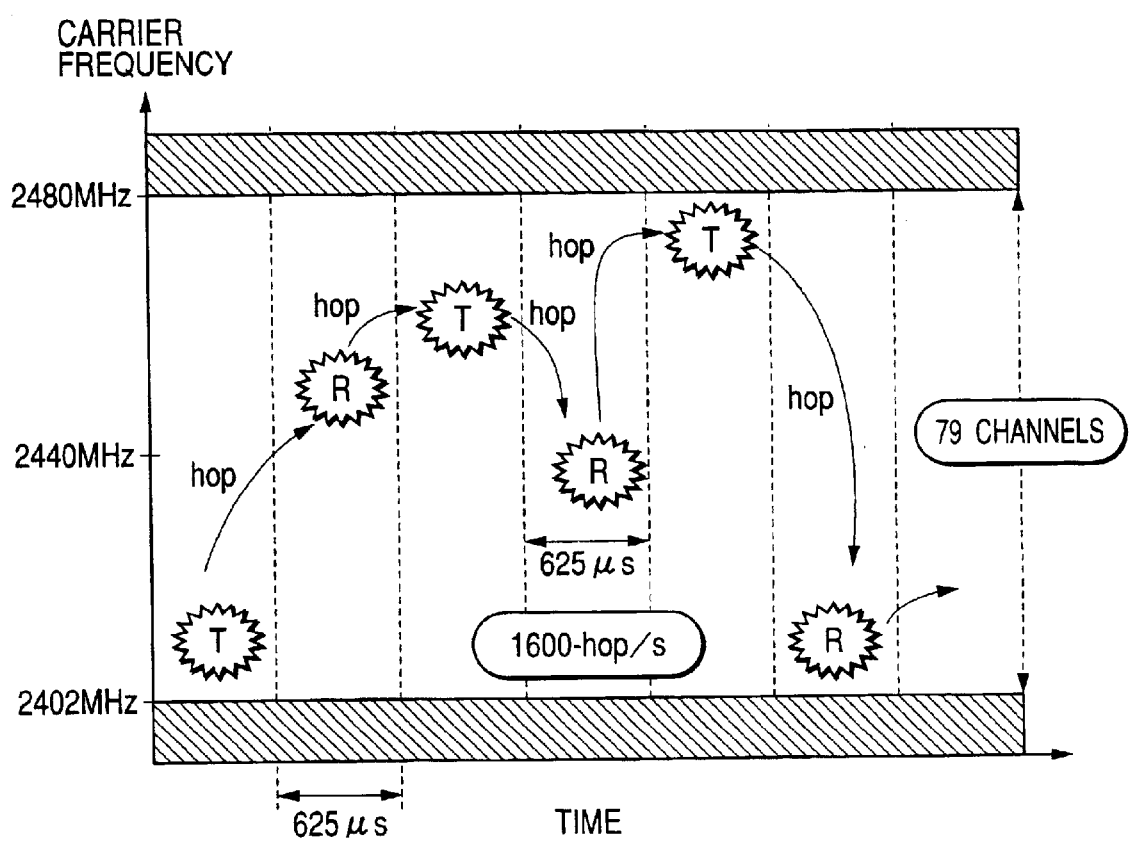
FIG. 9 is a conceptual diagram showing the frequency hopping of radio communication based on the Bluetooth protocol, to which the present invention is applied properly.

Next, the adjusting operation of the reference current Ir of the D/A conversion circuit 132 will be explained in connection with the flowchart of FIG. 8.

Initially, the control voltage Vcnt1 of a proper level is applied to the VCO 134 so that it oscillates: (steps S1, S2). The enable signal EN is given to the register 141 so that the counter 136 counts the oscillation output of the VCO 134 for a certain duration, and the count value indicative of the oscillation frequency of the VCO 134 is read out of the counter 136 via the register 141: (step S3). The control voltage Vcnt1 is altered in level so that the VCO 134 operates at 2.44 GHz: (step S4). This oscillation frequency is also counted by the counter 136 for the duration, and the count value is memorized.

The trimming circuit 143 is controlled so that the reference current Ir of the D/A conversion circuit 132 is set to be maximum (2 mA) (step S5) With the maximum output level (100 mV) being applied to the modulation control terminal (Vcnt2), the VCO 134 is operated to oscillate: (step S6). At this time, the control voltage Vcnt1 is set equal to the voltage at the time of oscillation of VCO 134 at 2.44 GHz. The oscillation output of the VCO 134 in this oscillation state is counted with the counter 141, the difference of the count value from the count value obtained in step S4 is computed, thereby evaluating the deviation of modulation frequency from the intended oscillation frequency (1600 kHz), and the trimming value for nullifying the deviation is determined: (steps S7–S9).

With the determined trimming value being set to the trimming circuit 143, the D/A conversion circuit 132 is operated at the trimmed current value, and the control voltage Vcnt2 of the normal operation level provided by the D/A conversion circuit is applied to the VCO 134 so that it oscillates: (steps S10, S11). The oscillation output of the VCO 134 in this state is counted with the counter 141, the difference of the count value from the count value obtained in step S4 is computed, thereby confirming that the modulation frequency is equal to the intended oscillation frequency (1600 kHz):(steps S12, S13). On detecting the equality, the trimming operation is terminated, or otherwise the sequence returns to step S9 to determine and set another trimming value.

Figure 10:
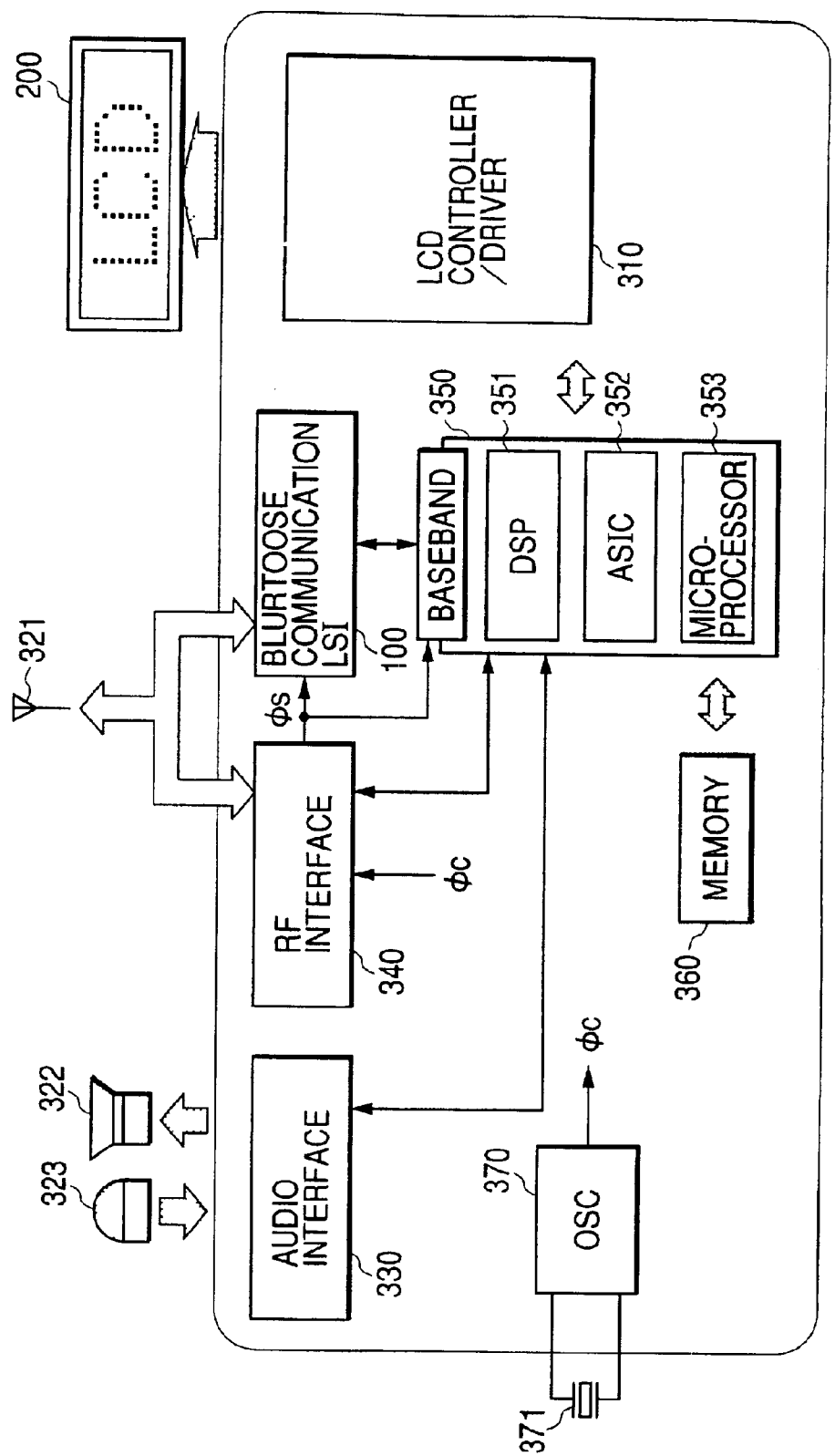
FIG. 10 is a block diagram showing the overall arrangement of a portable telephone set, with the radio communication LSI device of this invention being applied thereto.

FIG. 10 shows by block diagram the overall arrangement of a portable telephone set, with the radio communication LSI device of the foregoing embodiment being applied thereto.

This portable telephone set includes a liquid crystal display panel 200, a transmission/reception antenna 321, a voice output speaker 322, a voice input microphone 323, a display control driver 310 which operates the liquid crystal display panel 200, an audio interface 330 which transacts signals with the speaker 322 and microphone 323, an RF interface 340 which implements the portable telephone communication based on the GSM scheme via the antenna 321, a radio communication LSI device 100, with the present invention being applied, for implementing the communication based on the Bluetooth protocol via the antenna 321, a DSP (digital signal processor) 351 which implements the signal processing for the audio and RF signals, an ASIC (application specific integrated circuit) 352 which accomplishes a customized function (user logics), a system controller 353 including a microprocessor or microcomputer for controlling the overall telephone set inclusive of display control, a memory 360 for storing programs and data, and an oscillation circuit (OSC) 370.

The DSP 351, ASIC 352 and system controller 353 in unison constitute the baseband section 350. Although the telephone set shown in the figure has only one baseband section 350, it can also equip separately a baseband section for the RF interface 340 and another baseband section for the radio communication LSI device 100 of Bluetooth protocol. The oscillation circuit 370 is accompanied by a crystal oscillation element 371 so that it generates a clock signal tuned to 26 MHz for example.

The portable telephone set is equipped with the RF interface 340 for implementing the portable telephone communication based on the GSM scheme and the radio communication LSI device 100 for implementing the communication based on the Bluetooth protocol. Some prevailing portable telephone sets based on the GSM scheme use a 26-MHz system clock for the RF LSI device, and demultiply the clock frequency to 13 MHz to be used for the baseband section.

The radio communication LSI device 100 of the foregoing embodiment operating in compliance with the Bluetooth protocol also uses a 13-MHz clock as described previously. On this account, the system clock signal φc generated by the common oscillation circuit (OSC) 370 is supplied to the RF interface 340, and the 13-MHz clock signal φs which is supplied by the RF interface 340 to the baseband section 350 is also supplied to the radio communication LSI device 100 of Bluetooth protocol of the foregoing embodiment. Alternatively, the 26-MHz clock signal generated by the oscillation circuit 370 is supplied to the RF interface 340 of GSM, and the 13-MHz clock signal which is produced from the 26-MHz clock by frequency demultiplication is supplied to the baseband section 350 and the radio communication LSI device 100 of Bluetooth protocol.

In consequence, the need of providing a separate oscillation circuit for the Bluetooth protocol is eliminated, and even in case the radio communication LSI device 100 of Bluetooth protocol is added to an existing portable telephone set, the increase of hardware parts can be minimized. With the radio communication LSI device 100 of Bluetooth protocol being installed, it becomes possible for the portable telephone set to have a variety of functions including the operation as a transceiver, the printing of received data with a printer, and the reception of video and audio data from personal computers.

By installing the RF interface 340 and radio communication LSI device 100 of Bluetooth protocol of the foregoing embodiment on a notebook personal computer, hand-held personal computer, or palm personal computer, it becomes possible for these appliances to expand their functions including the data communication with personal computers and peripheral units which are based on the Bluetooth protocol and the connection to the Internet.

Although the present invention has been described in connection with the specific embodiments, the invention is not confined to these embodiments, but various alterations are obviously possible without departing from the essence of the invention.

For example, although the foregoing embodiment has been explained for the VCO used for the digital data communication apparatus which sends data by the rendition of frequency modulation, the present invention is applicable to general VCOs which have two control terminals and have their oscillation frequency controlled by the control voltages applied to these terminals.

Although the 5-bit D/A conversion circuit is used in the foregoing embodiment, the number of bits is not confined to 5 obviously. Instead of the D/A conversion circuit operating with the weighted currents, D/A conversion circuits of other types can also be used. Instead of operating the current adjusting circuit of the D/A conversion circuit in conjunction with the carrier frequency setting register, it may have a separate register.

Although the present invention has been explained mainly for its application to the VCO of radio communication apparatus, the present invention is not confined to this embodiment, but the inventive technique is useful for general apparatus having VCO.

Among the affairs of the present invention disclosed in this specification, the major effectiveness is briefed as follows.

It is possible to arrange an LC-oscillation VCO circuit which is immune to frequency deviation, and consequently it becomes possible for frequency-hopping radio communication apparatus employing this VCO to perform the crosstalk-alleviated and accurate data transmission.

What is claimed is:

1. A modulation semiconductor integrated circuit device comprising:

a voltage-controlled oscillation circuit coupled to receive a first control voltage to produce a carrier frequency signal, and coupled to receive a second control voltage to produce a modulation frequency signal based on data to be transmitted wherein the carrier frequency, is changed in a data transmission by changing the first control voltage so that the carrier frequency is hopping, and wherein the voltage-controlled oscillation circuit includes a capacitance element whose value is changed based on the first and the second control voltages, and a circuit for producing the second control voltage, whose reference current value is controlled in response to the change of the carrier frequency such that the variation of the second control voltage of the voltage-controlled oscillation circuit in response to the change of carrier frequency exhibits a characteristic that is opposite to the characteristic of modulation frequency deviation of the voltage-controlled oscillation circuit.

2. A modulation semiconductor integrated circuit device according to claim 1, further comprising:

a phase comparison circuit which compares in phase the oscillation output of said voltage-controlled oscillation circuit with a reference clock signal, and a control voltage generation circuit which generates, in accordance with the phase difference detected by said phase comparison circuit, such a voltage that the phase difference dissolves and applies as the first control voltage to said voltage-controlled oscillation circuit, said voltage-controlled oscillation circuit, said phase comparison circuit, and said control voltage generation circuit forming in unison a phase-locked loop.

3. A modulation semiconductor integrated circuit device according to claim 2, wherein said second control voltage is supplied to said voltage-controlled oscillation circuit through a path separate from the path of said phase-locked loop.

4. A modulation semiconductor integrated circuit device according to claim 1, wherein said circuit of producing the second control voltage includes a digital filter which samples a digital transmission data signal and implements a computation for the sampled signal, and a D/A conversion circuit which implements the D/A conversion for the output of said digital filter, said controlled reference current value being the reference current value of said D/A conversion circuit.

5. A modulation semiconductor integrated circuit device according to claim 2, wherein said phase-locked loop includes a variable counter circuit which counts the oscillation output of said oscillation circuit, and a register which sets a value to be counted by said variable counter circuit, the carrier frequency being changed in response to the alteration of the value set in said register, the reference current value being controlled in accordance with the value set in said register.

6. A modulation semiconductor integrated circuit device according to claim 1, further comprising:

a trimming circuit which adjusts the reference current value.

7. A modulation semiconductor integrated circuit device according to claim 1, wherein said voltage-controlled oscillation circuit includes a first variable capacitance means and a second variable capacitance means, and has its oscillation frequency varied in response to the variation in capacitance value of said first variable capacitance means by the first control voltage and in response to the variation in capacitance value of said second variable capacitance means by the second control voltage.

8. A modulation semiconductor integrated circuit device according to claim 5, wherein the count result of said variable counter circuit is accessible by read-out from the outside through an external terminal.

9. A modulation semiconductor integrated circuit device according to claim 8, wherein the count result of said variable counter circuit is accessible by read-out from the outside through an external terminal via said register and the register setting path.

10. A method of testing a semiconductor integrated circuit device which includes a voltage-controlled oscillation circuit having its oscillation frequency controlled by a first control voltage and a second control voltage individually, a phase comparison circuit which compares in phase the oscillation output of said voltage-controlled oscillation circuit with a reference clock signal, and a control voltage generation circuit which generates, in accordance with the phase difference detected by said phase comparison circuit, such a voltage that the phase difference dissolves and applies as the first control voltage to said voltage-controlled oscillation circuit, with said voltage-controlled oscillation circuit, said voltage-controlled oscillation circuit, said phase comparison circuit and said control voltage generation circuit being connected to form a phase-locked loop, said second control voltage being supplied to said voltage-controlled oscillation circuit through a path separate from the path of said phase-locked loop, said method by includes the steps of:

applying the second control voltage in the test operation the second control voltage being made higher than the voltage for normal operation, counting the output of said voltage-controlled oscillation circuit with a counter, and determining any variation of the output frequency of said voltage-controlled oscillation circuit caused by the second control voltage, by making reference to the count value of said counter in a predetermined time duration.

11. A modulation semiconductor integrated circuit device comprising:

a first circuit, including a voltage-controlled oscillation circuit having first and second inputs, arranged to receive a reference signal and to provide a first voltage control signal to the first input of the voltage-controlled oscillation circuit; and a second circuit arranged to receive data for transmission and to provide a second voltage control signal to the second input of said voltage-controlled oscillation circuit, wherein said first circuit is a phase-locked loop circuit further including a demultiplier arranged to receive an output from said voltage-controlled oscillation circuit, a counter arranged to receive an output of the demultiplier, a phase comparator arranged to receive the reference signal and an output from the counter, a charge pump arranged to receive an output of the phase comparator, and a loop filter arranged to receive an output of the charge pump and to output the first voltage control signal to the first input of the voltage-controlled oscillation circuit.

12. A modulation semiconductor integrated circuit device according to claim 11, wherein the second circuit includes a Gaussian filter circuit arranged to receive the data for transmission, a digital-to-analog converter circuit arranged to receive an output of the Gaussian filter circuit, a low-pass filter circuit arranged to receive an output of the digital-to-analog converter circuit and to output the second voltage control signal for input to the second input of the voltage-controlled oscillation circuit, and a current adjust circuit arranged to adjust a reference current value of the digital-to-analog converter circuit in response to a change of the carrier frequency, thereby changing the second control voltage input to the voltage-controlled oscillation circuit in response to the change of carrier frequency, whereby the second control voltage input to the voltage-controlled oscillation circuit changes so as to oppose a modulation frequency deviation of the voltage-controlled oscillation circuit, and wherein the second circuit varies the second voltage control signal to modulate a carrier frequency signal output by the voltage-controlled oscillation in accordance with a change in the carrier frequency.

* * * * *